(12) United States Patent
Permuy

(10) Patent No.: US 9,093,426 B2
(45) Date of Patent: Jul. 28, 2015

(54) ELECTRONIC SEMI-CONDUCTOR DEVICE INTENDED FOR MOUNTING IN A PRESSED STACK ASSEMBLY, AND A PRESSED STACK ASSEMBLY COMPRISING SUCH DEVICE

(71) Applicant: GE Energy Power Conversion Technology Ltd, Rugby, Warwickshire (GB)

(72) Inventor: Alfred Permuy, Rueil-Malmaison (FR)

(73) Assignee: GE Energy Power Conversion Technology Ltd. (GB)

( * ) Notice: Subject to any disclaimer, the term of this patent is extended or adjusted under 35 U.S.C. 154(b) by 55 days.

(21) Appl. No.: 13/957,799

(22) Filed: Aug. 2, 2013

(65) Prior Publication Data

US 2014/0035119 A1    Feb. 6, 2014

(30) Foreign Application Priority Data

Aug. 3, 2012 (FR) ...................... 12 57603

(51) Int. Cl.
*H05K 7/20* (2006.01)
*H01L 23/473* (2006.01)
(Continued)

(52) U.S. Cl.
CPC ............ *H01L 23/473* (2013.01); *H01L 23/051* (2013.01); *H01L 24/72* (2013.01);
(Continued)

(58) Field of Classification Search
CPC .................. H05K 7/20218; H05K 7/20254
USPC ........ 361/688–723, 679.46–679.54; 165/80.4
See application file for complete search history.

(56) References Cited

U.S. PATENT DOCUMENTS 4,381,032 A * 4/1983 Cutchaw .......... 165/46
5,022,462 A * 6/1991 Flint et al. .......... 165/80.4

5,247,425 A * 9/1993 Takahasi .......... 361/717
5,705,853 A 1/1998 Faller et al.

FOREIGN PATENT DOCUMENTS

EP    1209742    5/2002
EP    1376690    1/2004
(Continued)

OTHER PUBLICATIONS

French Search Report from corresponding FR application No. 1257603, filed Aug. 3, 2012, dated May 22, 2013.

*Primary Examiner* — Cuong Q Nguyen
*Assistant Examiner* — Nishath Yasmeen
(74) *Attorney, Agent, or Firm* — GE Global Patent Operation; Catherine J. Toppin

(57) ABSTRACT

A semi-conductor electronic device for mounting in a pressed stack assembly. The device comprises a box comprising a lower plate, an upper plate and a lateral wall mechanically connecting the lower plate to the upper plate, the lower and upper plates being electrically conductive, several semi-conductor components, each component comprising a first electrode and a second electrode, the first electrodes being electrically connected to the lower plate and the second electrodes being electrically connected to the upper plate, and elastic parts positioned between the components and a supporting plate chosen from the lower plate and the upper plate. The device comprises, in addition, an intermediate sealing wall positioned inside the box, between the components and the elastic parts, the intermediate sealing wall electrically connecting the components, the intermediate sealing wall being adapted to separate the components from an electrically insulating cooling liquid, adapted to circulate around the elastic parts, between the intermediate sealing wall and the supporting plate.

10 Claims, 3 Drawing Sheets

(51) Int. Cl.
*H01L 23/00* (2006.01)
*H01L 25/07* (2006.01)
*H01L 23/051* (2006.01)

(52) U.S. Cl.
CPC ...... *H01L 25/072* (2013.01); *H01L 2924/1305* (2013.01); *H01L 2924/1306* (2013.01); *H01L 2924/13055* (2013.01); *H01L 2924/13091* (2013.01)

(56) References Cited

FOREIGN PATENT DOCUMENTS

| | | |
|---|---|---|
| GB | 2241112 | 8/1991 |
| JP | 56130955 | 10/1981 |
| JP | 11214599 | 8/1999 |
| JP | 2005-101489 | 4/2005 |

* cited by examiner

ELECTRONIC SEMI-CONDUCTOR DEVICE INTENDED FOR MOUNTING IN A PRESSED STACK ASSEMBLY, AND A PRESSED STACK ASSEMBLY COMPRISING SUCH DEVICE

CROSS-REFERENCE TO RELATED APPLICATIONS

This application claims foreign priority under 35 U.S.C. §119 to co-pending French Patent Application No. 1257603, filed Aug. 3, 2012, which is hereby incorporated by reference in its entirety.

BACKGROUND OF THE INVENTION

Embodiments of the present invention relate to an electronic semi-conductor device and, more particularly, an electronic semi-conductor device intended for mounting a pressed stack assembly.

Such a pressed stack assembly comprising several semi-conductor electronic devices is usually provided in a power module, as for example a converter meant for supplying electrical energy to an electrical engine, more particularly with electrical power larger than the megawatt.

Such an assembly is commonly referred by the assembly name "press-pack", the electronic devices being pressed by means of two outer lateral flanges secured by two longitudinal rods parallel to the stacking axis. The electronic devices are stacked and compressed under several tons of pressure along the vertical stacking axis.

We are familiarized with an electronic device of the type mentioned earlier from document U.S. Pat. No. 5,705,853 A. This electronic device comprises a box and several chips positioned in the box, each chip being made of semi-conductor material. The box comprises a lower plate, an upper plate and a lateral cap plate, mechanically connecting the lower plate to the upper plate. The lower and upper plates are electrically conductive, and each chip comprises two electrodes, one electrode being electrically connected to the lower plate and the other electrode being electrically connected to the upper plate.

This electronic device also comprises electrically and thermally conductive springs, each spring being positioned between the upper plate and a contact switch hook plunger, the switch hook plunger being supported against the corresponding electrode of the chip made of semi-conductor material. These springs facilitate the manufacture of the electronic device.

However, such an electronic device sometimes presents temperature peaks while operating which are likely to cause deterioration of one or several of the semi-conductor components of the electronic device, the springs ensuring simultaneous electrical transfer of the current between the upper plate and the chips and thermal transfer of the heat released by the chips towards the outside.

BRIEF SUMMARY OF THE INVENTION

Embodiments of the present invention offer a semi-conductor electronic device enabling reduction of the maximum temperature during operation of the semi-conductor components, in order to prevent deterioration of the latter.

According to an embodiment of the present invention, there is provided an electronic semi-conductor intended for mounting in a pressed stack assembly. The electronic semi-conductor comprises a box comprising a lower plate, an upper plate and a lateral wall mechanically connecting the lower plate to the upper plate, the lower and upper plates being electrically conductive, several semi-conductor components, each semi-conductor component comprising a first electrode and a second electrode, the first electrodes being electrically connected to the lower plate and the second electrodes being electrically connected to the upper plate, and elastic parts, in an embodiment electrically conductive, positioned between the semi-conductor components and a supporting plate chosen between the lower plate and the upper plate.

Embodiments of the present invention provide an electronic device of the type mentioned above, characterized in that it comprises, in addition, an intermediate sealing wall positioned inside the box, between the semi-conductor components and the elastic parts, the intermediate sealing wall electrically connecting the semi-conductor components, the electrically insulating intermediate sealing wall being adjusted to separate the semi-conductor components from a cooling liquid, adapted to circulate around the elastic parts, between the intermediate sealing wall and the supporting plate.

According to embodiments of the present invention, the electronic device comprises one or several of the following characteristics, taken individually or according to all the technically possible combinations: the intermediate sealing wall comprises an electrically conductive intermediate plate positioned in contact with the semi-conductor components and a sealing joint positioned between the intermediate plate and the lateral wall; the lateral wall is electrically insulating and the elastic parts are electrically conductive; the lateral wall comprises a first section and a second section positioned on both sides of the intermediate sealing wall along the vertical direction, the first section being electrically insulating and positioned between the intermediate sealing wall and the plate apart from the supporting plate among the lower plate and the upper plate, and the second section being positioned between the intermediate sealing wall and the supporting plate, the second section being, in an embodiment, electrically conductive; the intermediate plate extends, perpendicular to the vertical direction, up to the outer edge of the lateral wall; the intermediate plate comprises a first intermediate plate and a second intermediate plate positioned one above the other along the vertical direction, the first intermediate plate being positioned in contact with the semi-conductor components and the first section, and the second intermediate plate being positioned in contact with the elastic parts and the second section; the device comprises, in an embodiment, a circulation circuit for a second cooling liquid inside the plate apart from the supporting plate between the lower plate and the upper plate, the circulation circuit, comprising a cavity (provided inside said plate apart from the supporting plate); the lower plate and the upper plate are essentially planar and parallel to each other, and the elastic parts are elastic along a direction approximately perpendicular to the upper and lower plates; each elastic part is a component chosen from among the group consisting of: a spring and a piston; each semi-conductor component is a component chosen from among the group consisting of: an IGBT transistor, an IEGT transistor, a MOSFET transistor and a diode; and the lateral wall comprises at least one orifice for passage of the cooling liquid, or each orifice for passage crossing the lateral wall, or each orifice for passage being adapted to be connected to a driving device for the cooling liquid.

According to an embodiment of the present invention, there is provided a pressed stack assembly comprising several semi-conductor electronic devices pressed along a vertical stacking axis, characterized in that at least one semi-conductor electronic device is such as defined above.

BRIEF DESCRIPTION OF THE DRAWINGS

These characteristics and advantages of the invention will become apparent by reading the description which follows, given by non-limiting examples, and with reference to the attached drawings, in which.

DETAILED DESCRIPTION

In the present application, the expression "approximately equal to" will express a relation of equality to more or less 5%.

Figure 1:
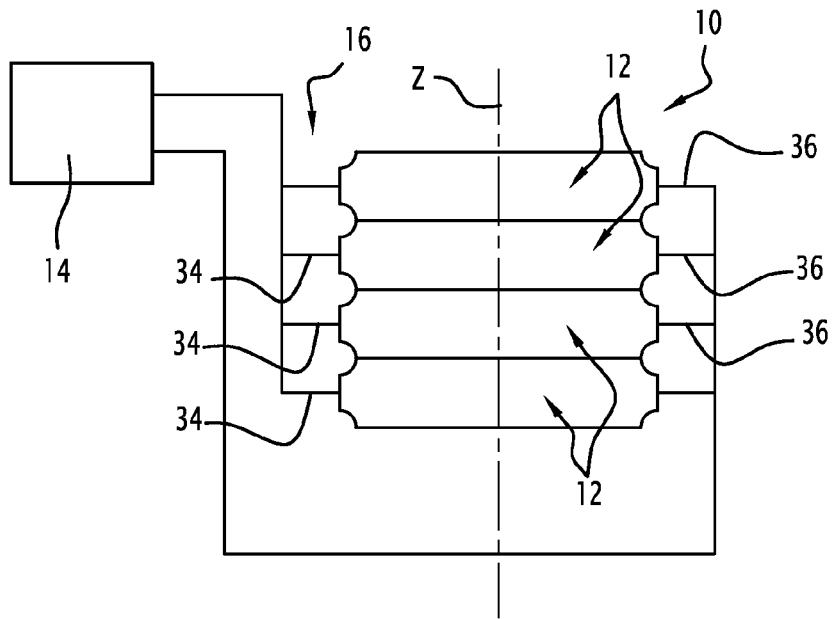
FIG. 1 is a schematic representation of a pressed stack assembly comprising several semi-conductor electronic devices pressed along a vertical stacking axis according to an embodiment of the present invention.

In FIG. 1, a pressed stack assembly 10 comprises several semi-conductor electronic devices 12 pressed along a vertical stacking axis Z, the semi-conductor electronic devices 12 being connected to a driving device 14 for the cooling liquid, via a cooling circuit 16.

The pressed stack assembly 10 is also called pile, and the electronic devices 12 are pressed by means of two lateral outer flanges, not shown, secured by two longitudinal rods, not shown, parallel to the stacking axis. The electronic devices 12 are stacked and compressed under several tons of pressure along the vertical stacking axis.

The pressed stack assembly 10 is, in an embodiment, incorporated into a converter intended for converting electrical energy in order to power an electric engine, the latter having electrical power more particularly greater than 1 MW, more particularly even greater than 10 MW.

Each electronic device 12 is stacked and compressed under several tons of pressure along the vertical stacking axis Z, and is also called "press-pack" device.

Figure 2:
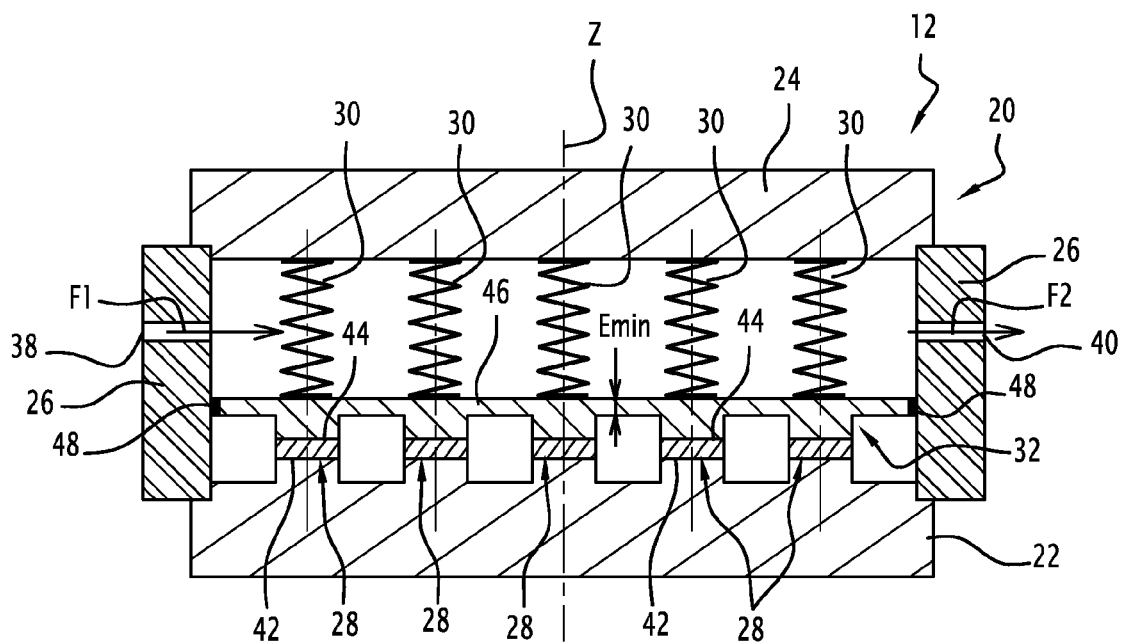
FIG. 2 is a schematic representation and as a section of an electronic device of FIG. 1 according to an embodiment of the present invention.

Each electronic device 12 comprises a box 20 with a lower plate 22, an upper plate 24 and a lateral wall 26 mechanically connecting the lower plate 22 to the upper plate 24, as shown in FIG. 2.

Each electronic device 12 comprises several semi-conductor components 28 and elastic parts 30 positioned between the semi-conductor components 28 and a supporting plate chosen from the lower plate 22 and the upper plate 24.

In an embodiment in FIG. 2, the supporting plate is the upper plate 24. In an embodiment, not shown, the supporting plate is the lower plate 22.

The electronic device 12 comprises, in an embodiment, an elastic part 30 for each semi-conductor component 28.

Each electronic device 12 comprises, in addition, an intermediate sealing wall 32 positioned inside box 20, between the semi-conductor components 28 and the elastic parts 30, the intermediate sealing wall 32 electrically connecting the semi-conductor components 28 between them.

Each electronic device 12 is, in an embodiment, in the form of a cylindrical slab, and the lower 22 and upper 24 plates are therefore circular, the lateral wall 26 being ring-shaped.

The electrically insulating driving device 14, seen in FIG. 1, is adapted to cause the circulation of the cooling liquid within the cooling circuit 16, as well as in each of the electronic devices 12. The driving device 14 comprises a pump, not shown.

The cooling circuit 16 comprises first circulation channels 34 and second circulation channels 36 connecting each electronic device 12 to the driving device 14 in order to ensure the circulation of the cooling liquid inside each electronic device 12, as shown in FIG. 1. The cooling circuit 16 is, in an embodiment, a closed loop circuit between the electronic devices 12 and the driving device 14.

The cooling liquid is electrically insulating and comprises, in an embodiment, DI water.

The lower and upper plates 22, 24 are electrically conductive. In an embodiment in FIG. 2, the lower and upper plates 22, 24 are essentially planar and parallel to each other. They are perpendicular to the vertical stacking axis Z.

The lateral wall 26 is electrically insulating in an embodiment. The lateral wall is, in an embodiment, made of ceramic material. The lateral wall 26 is, in an embodiment, in the form of a revolving wall around the vertical stacking axis Z.

The lateral wall 26 comprises a first orifice 38 for passage of the cooling liquid, the first orifice for passage 38 intended to be connected to a corresponding first channel 34, and a second orifice 40 for passage of the cooling liquid, the second orifice for passage 40 intended to be connected to a corresponding second channel 36.

Each semi-conductor component 28 comprises a first electrode 42 and a second electrode 44, the first electrodes 42 of the several components 28 being electrically connected to the lower plate 22 and the second electrodes 44 of the several components 28 being electrically connected to the upper plate 24.

In an embodiment in FIG. 2, the first electrodes 42 are positioned directly in contact with the lower plate 22. In other words, the first electrodes 42 are each supported against the lower plate 22. The second electrodes 44 are positioned directly in contact with the intermediate sealing wall 32 and electrically connected to the upper plate 24 by means of said sealing wall 32 and elastic parts 30.

Each semi-conductor component 28 is a component chosen from among the group consisting of: an IGBT transistor (Insulated Gate Bipolar Transistor), an IEGT transistor (Injection Enhanced Gate Transistor), a MOSFET transistor (Metal Oxide Semiconductor Field Effect Transistor) and a diode.

All the semi-conductor components 28 are, in an embodiment, of the same type for a given semi-conductor electronic device 12, in order to obtain a semi-conductor electronic device 12 of the type of the semi-conductor components 28 which they comprise. All the semi-conductor components 28 are, in an embodiment, IGBT transistors, and the semi-conductor electronic device 12 is therefore an IGBT transistor. In an embodiment, all the semi-conductor components 28 are diodes, and the semi-conductor electronic device 12 is therefore a diode.

In an embodiment, the same semi-conductor electronic device 12 comprises semi-conductor components 28 of various types. The semi-conductor electronic device 12 comprises, in an embodiment, a mixture of IGBT transistors 28 and diodes 28.

The elastic parts 30 are compressed between the supporting plate 24, on one hand, and the intermediate sealing wall 32, on the other hand.

The elastic parts 30 are elastic along a direction approximately perpendicular to the lower 22 and upper 24 plates. In other words, the elastic parts 30 have a direction of elasticity, and the direction of elasticity is approximately perpendicular to the lower 22 and upper 24 plates. In an embodiment in FIG. 2, the direction of elasticity of the elastic parts 30 is approximately parallel to the vertical stacking axis Z.

Each elastic part 30 comprises, in an embodiment, a spring, such as a coil spring, as shown in FIG. 2. In an embodiment not shown, each elastic part 30 comprises a piston.

In an embodiment, the elastic parts 30 are essentially electrically conductive, in order to ensure continuity of circulation of the electric current from the lower plate 22 to the supporting plate 24, the lateral wall 26 being electrically insulating in this embodiment.

The intermediate sealing wall 32 is adapted to separate the semi-conductor components 28 of the electrically insulating cooling liquid adapted to circulate around the elastic parts 30, between the intermediate sealing wall 32 and the supporting plate 24.

In other words, the intermediate sealing wall 32 is adapted to form along with the supporting plate 24 and the lateral wall 26, a cavity for circulation of the cooling liquid into the electronic device 12, the cooling liquid being intended to penetrate into the electronic device 12 through the first orifice for passage 38 (arrow F1) and to emerge from the latter via the second orifice for passage 40 (arrow F2). The cooling liquid is adapted to circulate around the elastic parts 30 from the first orifice for passage 38 towards the second orifice for passage 40.

In an embodiment in FIG. 2, the intermediate sealing wall 32 comprises an electrically conductive intermediate plate 46, positioned in contact with the semi-conductor components 28, and a sealing joint 48 positioned between the intermediate plate 46 and the lateral wall 26.

The elastic parts 30 are then supported against the electrically conductive intermediate plate 46, on one hand, and the supporting plate 24 on the other hand, so as to enable continuity of circulation of the electric current from the lower plate 22, across the semi-conductor components 28, the intermediate plate 46 and the electrically conductive elastic parts 30, to the supporting plate 24, while facilitating manufacture of the electronic device12.

The first 38 and second 40 orifices for passage are each in the form of a hole provided across the lateral wall 26. In other words, each orifice for passage 38, 40 passes right through the lateral wall 26. The first and second orifices for passage 38, 40 are adapted to be connected to the driving device of the cooling liquid 14 via the corresponding first and second channels 34, 36.

The intermediate plate 46 is supported against the second electrodes 44 of the semi-conductor components 28. The intermediate plate 46 is, in an embodiment, circular, and the sealing joint 48 is therefore a circular joint positioned at the edge of the intermediate plate 46.

The intermediate plate 46 is adapted to stretch under the effect of the force exerted by the elastic parts 30 supported against the upper plate 24. The intermediate plate 46 has minimum thickness Emin in the areas which are not beside a semi-conductor component 28. The minimum thickness Emin is, in an embodiment, approximately equal to 1 mm.

The intermediate plate 46 is, in an embodiment, made of an electrically conductive material and compatible with the cooling liquid, such as steel.

The sealing joint 48 is, in an embodiment, a metal-ceramic solder made between the intermediate plate 46 and the lateral wall 26, to the edge of the intermediate plate 46.

The electronic device 12 according to an embodiment therefore enables improved cooling of the semi-conductor components 28 while they are operating and electrically powered, due to the circulation of the cooling liquid around the electrically conductive elastic parts 30.

The first and second orifices for passage 38, 40 are intended to enable the cooling liquid to penetrate into the electronic device 12, between the intermediate sealing wall 32 and the supporting plate 24, via the first orifice for passage 38 (arrow F1), then to circulate between the intermediate sealing wall 32 and the supporting plate 24, before emerging from the electronic device 12 via the second orifice for passage 40 (arrow F2).

The cooling liquid while circulating in contact with the intermediate sealing wall 32 and the elastic parts 30 makes it possible to ensure effective elimination of the heat resulting from heating of the semi-conductor components 28 while operating, at the same time not hampering the operation of said semi-conductor components 28 owing to the presence of the sealing wall 32 separating the semi-conductor components 28 from the cooling liquid. The pressure of the cooling liquid is, in an embodiment, a few bars.

In addition, the presence of elastic parts 30 facilitates the manufacture of the electronic device 12, as known per se, particularly from the document U.S. Pat. No. 5,705,853 A mentioned earlier.

It is perceived therefore that the semi-conductor electronic device 12 according to an embodiment enables reduction of the maximum operating temperature of the semi-conductor components 28, so as to prevent deterioration of the latter.

Figure 3:
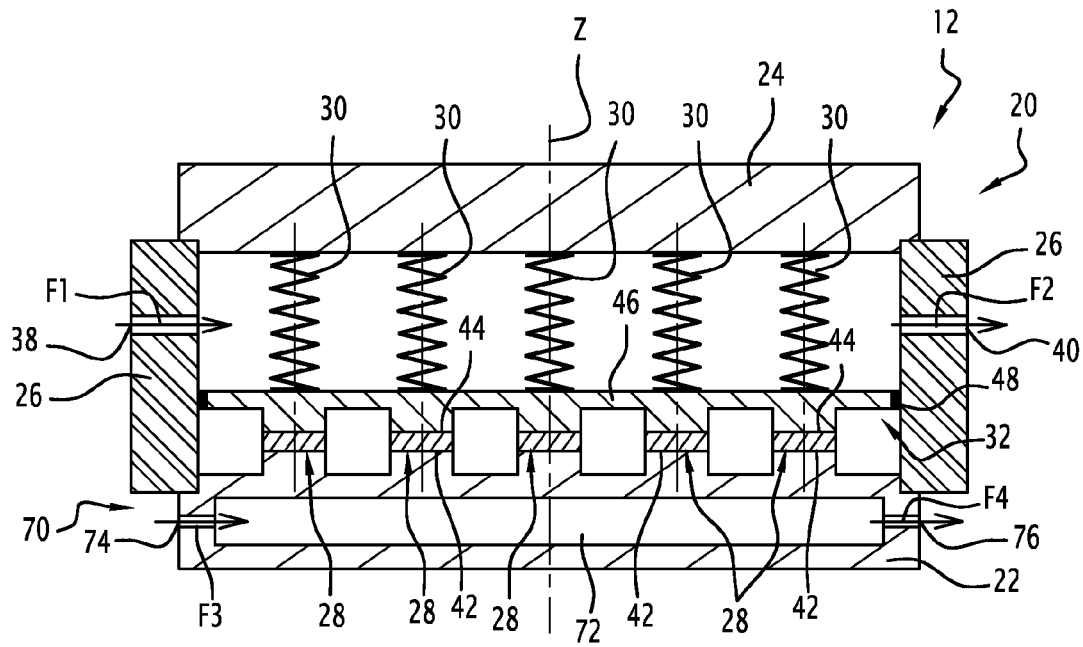
FIG. 3 is a similar view of that of FIG. 2 according to an embodiment of the present invention.

FIG. 3 illustrates an embodiment of the present invention, for which the components similar to the embodiment illustrated in FIG. 2, described earlier are identified by the same references, and are not described once again.

According to an embodiment, the device 12 comprises, in addition, a circulation circuit 70 for a second cooling liquid inside the plate apart from the supporting plate chosen from the lower plate 22 and the upper plate 24, the circulation circuit 70 comprising a cavity 72 provided in said plate apart from the supporting plate.

Figure 4:
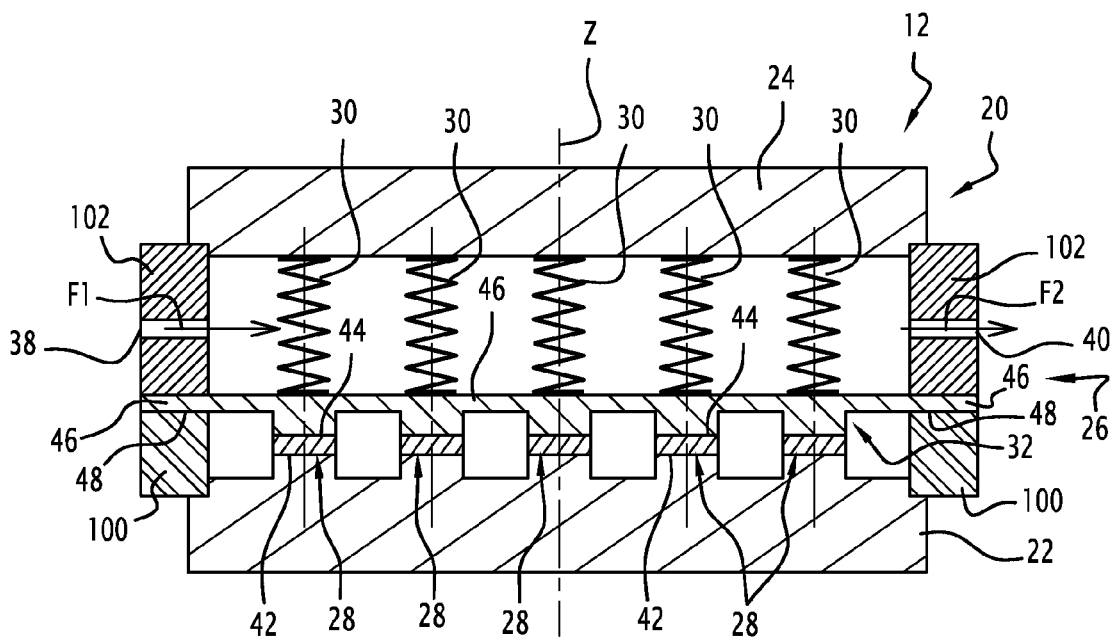
FIG. 4 is a similar view of that of FIG. 2 according to an embodiment of the present invention.

In an embodiment shown in FIG. 4, the supporting plate is the upper plate 24, and the plate apart from the supporting plate is the lower plate 22. In other words, the cavity 72 is provided inside the lower plate 22.

The plate 22 apart from the supporting plate 24 comprises, in addition, a third orifice 74 for passage of the second cooling liquid and a fourth orifice 76 for passage of the second cooling liquid.

The third and fourth orifices for passage 74, 76 are each in the form of a hole passing between the cavity 72 and the outside of the plate apart from the supporting plate. The third and fourth orifices for passage 74, 76 are intended to form a communication between the cavity 72 and the outside, so as to enable the second cooling liquid to penetrate inside the cavity 72 via the third orifice for passage 74 (arrow F3), then to circulate within said cavity 72, before emerging from said cavity 72 via the fourth orifice for passage 76 (arrow F4).

The second cooling liquid is, in an embodiment, identical to the first cooling liquid circulating across the cooling circuit 16 and is therefore led by the driving device 14. The third and fourth orifices for passage 74, 76 are then connected to the cooling circuit 16 by means of the corresponding first and second channels 34, 36.

The operation of several embodiments is similar to that of the other embodiments described earlier, and is not described again.

The electronic device 12 according to an embodiment serves to further improve cooling of the semi-conductor components 28 by ensuring circulation of the cooling liquid on both sides of the semi-conductor components 28 along the vertical stacking axis Z corresponding to the direction of circulation of the electric current. In other words, the electronic device 12 according to an embodiment enables circulation of the cooling liquid beside each of the first and second electrodes 42, 44.

FIG. 4 illustrates an embodiment of the present invention for which the components similar to previously described embodiments are identified by the same references, and are not described again.

According to an embodiment, the lateral wall 26 comprises a first section 100 and a second section 102 positioned on each side of the intermediate plate 46 along the vertical direction Z.

The first section 100 is electrically insulating and positioned between the lower plate 22 and the intermediate plate 46. The first section 100 is, in an embodiment, made of ceramic material.

The second section 102 is electrically conductive and positioned between the intermediate plate 46 and the upper plate 24. The second section 102 is, in an embodiment, made from the same material as the lower and upper plates 22, 24.

The second section 102 comprises the first orifice 38 for passage of the cooling liquid, the first orifice for passage 38 intended to be connected to a corresponding first channel 34, and the second orifice 40 for passage of the cooling liquid, the second orifice for passage 40 intended to be connected to a corresponding second channel 36.

The first and second sections 100, 102 are, in an embodiment, each in the form of a revolving wall around the vertical stacking axis Z.

The intermediate plate 46 therefore extends, perpendicular to the vertical direction Z, up to the outer edge of the lateral wall 26, that is to say, up to the outer edge of the first section 100 and the second section 102.

The sealing joint 48 is, in an embodiment, a metal-ceramic solder made between the intermediate plate 46 and the first section 100. The metal-ceramic solder is, in an embodiment, positioned between a transverse face of the intermediate plate 46 and a corresponding transverse face of the first section 100, said transverse faces being opposite each other and extending perpendicular to the vertical direction Z.

The operation of the embodiment of FIG. 4 is similar to that of the embodiments described earlier, and is not described once again.

The electric current between the semi-conductor components 28 and the upper face 24 is adapted to circulate across the elastic parts 30 and, in addition, across the second section 102.

In an embodiment, the elastic parts are not electrically conductive and the electric current between the semi-conductor components 28 and the upper face 24 is adapted to circulate only across the second section 102.

The electronic device 12 according to an embodiment enables further improvement of the circulation of the electric current between the semi-conductor components 28 and the upper face 24, all the while maintaining adequate cooling of the semi-conductor components 28.

Figure 5:
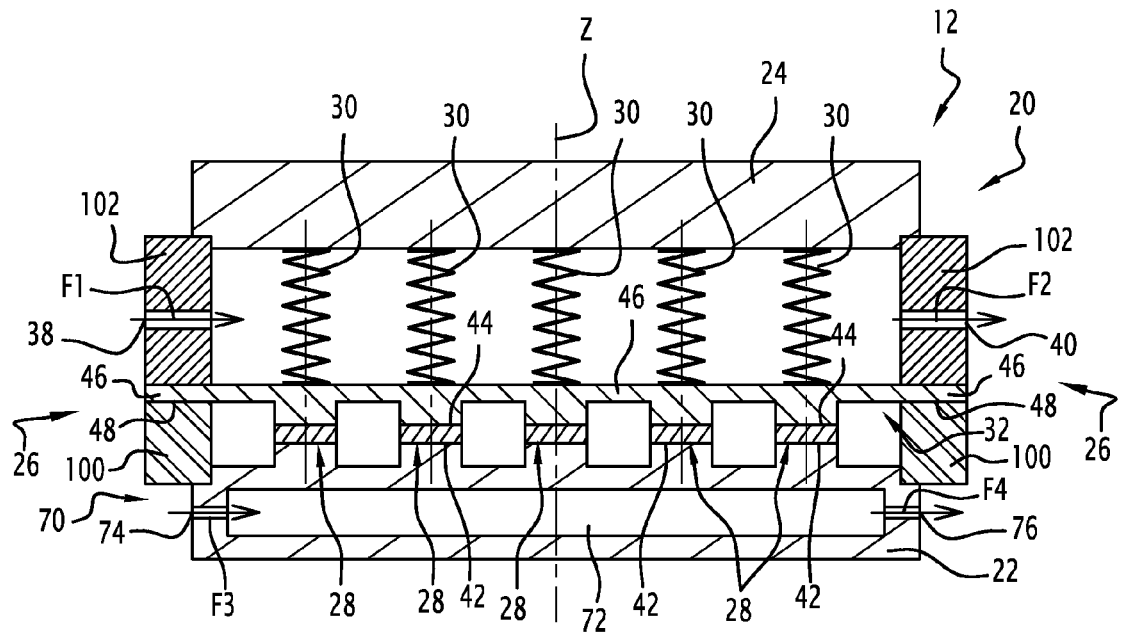
FIG. 5 is a similar view of that of FIG. 2 according to an embodiment of the present invention.

FIG. 5 illustrates an embodiment of the present invention for which the components similar to previously described embodiment, described earlier, are identified by the same references, and are not described once again.

According to an embodiment, the device 12 comprises, in addition, the circulation circuit 70 for the second cooling liquid inside the plate apart from the supporting plate from the lower plate 22 and the upper plate 24, the circulation circuit 70 comprising the cavity 72 provided in said plate apart from the supporting plate, such as described earlier for an embodiment illustrated in FIG. 3.

In an embodiment illustrated in FIG. 5, the supporting plate is the upper plate 24, and the plate apart from the supporting plate is the lower plate 22. In other words, the cavity 72 is provided inside the lower plate 22.

The plate 22 apart from the supporting plate 24 comprises, in addition, the third orifice 74 for passage of the second cooling liquid and the fourth orifice 76 for passage of the second cooling liquid, as described earlier.

The operation of the embodiment illustrated in FIG. 5 is similar to that of the embodiments illustrated in FIG. 2 described earlier, and is not described once again.

The electronic device 12, according to an embodiment, enables optimization of the cooling time of the semi-conductor components 28, by ensuring circulation of the cooling liquid on both sides of the semi-conductor components 28 along the vertical stacking axis Z corresponding to the direction of circulation of the electric current, and the circulation of the electric current between the semi-conductor components 28 and the upper face 24, across the second section 102.

Figure 6:
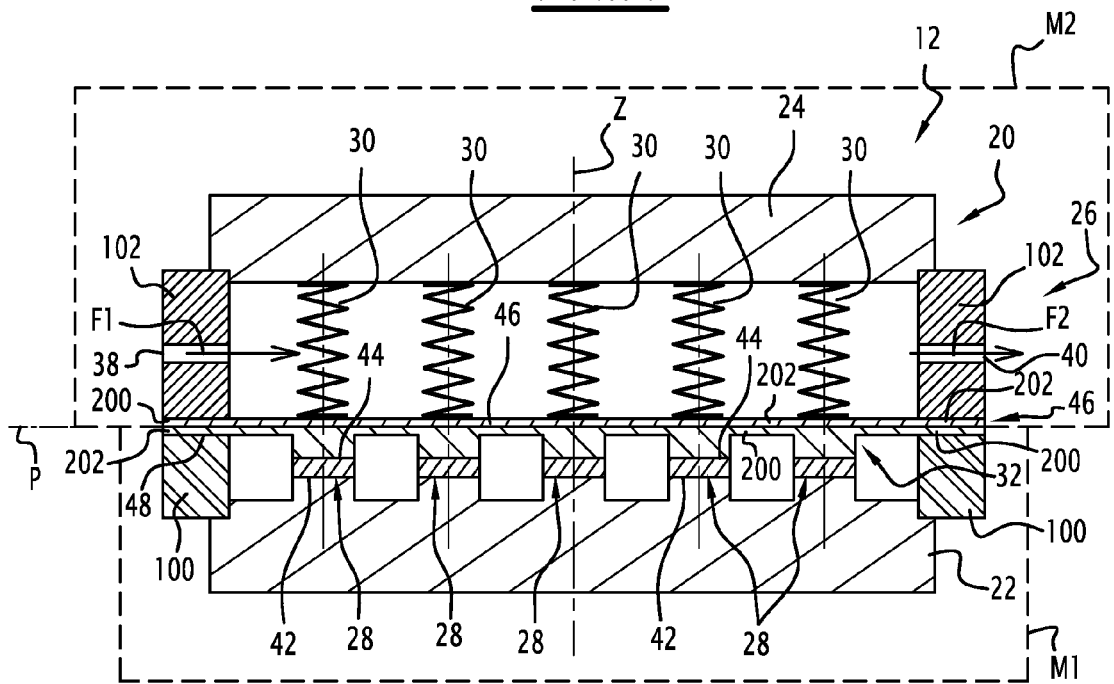
FIG. 6 is a similar view of that of FIG. 2 according to an embodiment of the present invention.

FIG. 6 illustrates an embodiment of the present invention for which the components similar to the embodiments, described earlier, are identified by the same references, and are not described once again.

According to an embodiment, the intermediate plate 46 is divided into two along a median transverse plane P, namely into a first intermediate plate 200 and a second intermediate plate 202. The transverse plane P extends perpendicular to the vertical direction Z.

In other words, the intermediate plate 46 comprises the first intermediate plate 200 and the second intermediate plate 202 positioned one above the other along the vertical direction Z.

The first intermediate plate 200 is positioned in contact with the semi-conductor components 28 and fixed to the first section 100.

The second intermediate plate 202 is positioned in contact with the elastic parts 30 and fixed to the second section 102.

The first and second intermediate plates 200, 202 form the intermediate plate 46 and are electrically conductive. They are, in an embodiment, made from the same electrically conductive material.

The sealing joint 48 is, in an embodiment, a metal-ceramic solder made between the first intermediate plate 200 and the first section 100. The metal-ceramic solder is, in an embodiment, positioned between a transverse face of the first intermediate plate 200 and a corresponding transverse face of the first section 100, the said transverse faces being opposite to one another and extending perpendicular to the vertical direction Z.

The operation of an embodiment is similar to that of previously described embodiments are not described again.

An embodiment makes it possible to offer the electronic device 12 in a more modular form. In fact, the lower plate 22, the semi-conductor components 28, as well as the first section 100 and the first intermediate plate 200 fixed in between by the metal-ceramic solder, form a first module M1, and the second intermediate plate 202, the second section 102, the elastic parts 30 and the upper plate 24 form a second module M2, as shown in FIG. 6.

This facilitates, in addition, the manufacture of the electronic device 12 since the first module M1 comprising the semi-conductor components 28 needs to be assembled in an environment with reduced impurity levels, such as a clean room; while the second module M2 does not need to be assembled in an environment with reduced impurity levels.

According to an embodiment, not shown, the electronic device 12 is similar to the embodiments, described earlier, corresponding to FIG. 5 and the intermediate plate 46 is divided into two along a median transverse plane P, namely in the first intermediate plate 200 and in the second intermediate plate 202, as described earlier for the embodiment corresponding with FIG. 6. The transverse plane P extends perpendicular to the vertical direction Z.

The electronic device 12 according to an embodiment makes it possible to optimize the cooling time of the semi-conductor components 28, owing to the circulation of the cooling liquid beside each of the first and second electrodes 42, 44, and the circulation of the electric current between the semi-conductor components 28 and the upper face 24, across the second section 102. The electronic device 12 according to an embodiment offers, in addition, a modular arrangement with the first and second modules M1, M2, which facilitates manufacture.

It is therefore perceived that the semi-conductor electronic device 12 according to an embodiment of the present invention enables further reduction of the maximum operating temperature during operation of the semi-conductor components 28, so as to prevent deterioration of the latter.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A semi-conductor electronic device for mounting in a pressed stack assembly, the semi-conductor electronic device comprising:
    a box comprising a lower plate, an upper plate and a lateral wall mechanically connecting the lower plate to the upper plate, the lower plate and the upper plate being electrically conductive;
    a plurality of semi-conductor components, each of the plurality of semi-conductor components comprising a first electrode and a second electrode, the first electrodes being electrically connected to the lower plate and the second electrodes being electrically connected to the upper plate;
    elastic parts positioned between the plurality of semi-conductor components and a supporting plate which is chosen from the lower plate and the upper plate; and
    an intermediate sealing wall positioned inside the box, between the plurality of semi-conductor components and the elastic parts, wherein the intermediate sealing wall electrically connects the plurality of semi-conductor components, wherein the intermediate sealing wall is configured to separate the plurality of semi-conductor components from an electrically insulating cooling liquid, wherein the electrically insulating cooling liquid is configured to circulate around the elastic parts, between the intermediate sealing wall and the supporting plate.

2. The semi-conductor electronic device of claim 1, wherein the intermediate sealing wall comprises:
    an electrically conductive intermediate plate positioned in contact with the plurality of semi-conductor components; and
    a sealing joint positioned between the intermediate plate and the lateral wall.

3. The semi-conductor electronic device of claim 1, wherein the lateral wall is electrically insulating and the elastic parts are electrically conductive.

4. The semi-conductor electronic device of claim 1, wherein the lower plate and the upper plate are essentially planar and parallel to each other, and the elastic parts are elastic along a direction approximately perpendicular to the lower and upper plates.

5. The semi-conductor electronic device of claim 1, wherein each of the elastic parts is a component chosen from among the group consisting of a spring and a piston.

6. The semi-conductor electronic device of claim 1, wherein each of the plurality of semi-conductor components is a component chosen from among the group consisting of an IGBT transistor, an IEGT transistor, a MOSFET transistor and a diode.

7. The semi-conductor electronic device of claim 1, wherein the lateral wall comprises at least one orifice for passage of a cooling liquid, wherein the at least one orifice for passage passes through the lateral wall and is configured to be connected to a driving device for the cooling liquid.

8. The semi-conductor electronic device of claim 1, wherein the elastic parts are electrically conductive.

9. The semi-conductor electronic device of claim 8, wherein the intermediate sealing wall comprises:
    an electrically conductive intermediate plate positioned in contact with the plurality of semi-conductor components; and
    a sealing joint positioned between the intermediate plate and the lateral wall.

10. A pressed stack pile assembly comprising:
    a plurality of semi-conductor electronic devices pressed along a vertical stacking axis, wherein at least one semi-conductor electronic device comprises:
    a box comprising a lower plate, an upper plate and a lateral wall mechanically connecting the lower plate to the upper plate, the lower plate and the upper plate being electrically conductive;
    a plurality of semi-conductor components, each of the plurality of semi-conductor components comprising a first electrode and a second electrode, the first electrodes being electrically connected to the lower plate and the second electrodes being electrically connected to the upper plate;
    elastic parts positioned between the plurality of semi-conductor components and a supporting plate which is chosen from the lower plate and the upper plate; and
    an intermediate sealing wall positioned inside the box, between the plurality of semi-conductor components and the elastic parts, wherein the intermediate sealing wall electrically connects the plurality of semi-conductor components, wherein the intermediate sealing wall is configured to separate the plurality of semi-conductor components from an electrically insulating cooling liquid, wherein the electrically insulating cooling liquid is configured to circulate around the elastic parts, between the intermediate sealing wall and the supporting plate.

* * * * *